US006999848B2

(12) United States Patent
Helwig

(10) Patent No.: US 6,999,848 B2
(45) Date of Patent: Feb. 14, 2006

(54) PROCESS CONTROL APPARATUS, SYSTEMS, AND METHODS

(75) Inventor: Christofer C Helwig, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/742,477

(22) Filed: Dec. 19, 2003

(65) Prior Publication Data

US 2005/0136560 A1 Jun. 23, 2005

(51) Int. Cl.
*G06F 7/00* (2006.01)

(52) U.S. Cl. .................. 700/213; 700/121; 438/14

(58) Field of Classification Search .............. 700/1, 700/29, 109, 110, 121, 213; 438/14, 15, 438/17; 414/935, 936, 937, 939
See application file for complete search history.

(56) References Cited

U.S. PATENT DOCUMENTS

| 5,866,437 A | * | 2/1999 | Chen et al. ................ 438/14 |
| 5,926,690 A | * | 7/1999 | Toprac et al. ............. 438/17 |
| 6,041,270 A | * | 3/2000 | Steffan et al. ............ 700/121 |
| 6,320,402 B1 | * | 11/2001 | Phan et al. ............... 414/935 |
| 6,604,012 B1 | * | 8/2003 | Cho et al. ................ 700/121 |
| 6,625,497 B1 | * | 9/2003 | Fairbairn et al. .......... 700/1 |

OTHER PUBLICATIONS

*IMA News: The Newsletter of the Integrated Measurement Association*, vol. III. Issue 1, (May 30, 2003), pp. 1-9.

* cited by examiner

*Primary Examiner*—Khoi H. Tran
(74) *Attorney, Agent, or Firm*—Schwegman, Lundberg, Woessner & Kluth, P.A.

(57) ABSTRACT

An apparatus and a system, as well as a method and article, may operate to receive a critical dimension associated with each wafer included in a lot of wafers at a station controller coupled to a metrology tool, calculate a modified recipe time associated with each wafer in the lot based on the critical dimension and a base time, and send the modified recipe time in a message to a station controller coupled to an etch tool to process each of the wafers included in the lot.

22 Claims, 2 Drawing Sheets

PROCESS CONTROL APPARATUS, SYSTEMS, AND METHODS

TECHNICAL FIELD

Various embodiments described herein relate to process control generally, including apparatus, systems, and methods used to determine semiconductor wafer process time parameters.

BACKGROUND INFORMATION

Semiconductor wafers of the type typically used in the manufacture of integrated circuits may be processed in controlled environments, including specialized chambers. Increased emphasis within the industry on reduced feature size and improved yield lends importance to greater accuracy in process control.

Some wafer processing involves a procedure called "etching", wherein the wafers are exposed to reactive plasma gases after receiving photoresist film patterns. During etching, one or more wafer lots may be processed in a chamber, similar to or identical to the chambers included in a Telius plasma etch system available from Tokyo Electron Ltd. of Tokyo, Japan. To determine the amount of processing time in the chamber, or the "recipe time", characteristics of one of the wafers in a lot may be measured, and the result applied across one or more lots of wafers. However, since individual wafers within a lot are not identical, and measurements of identical structures within the same die may reveal variations on the order of 15%, this method may provide uneven results.

DETAILED DESCRIPTION

Figure 1:
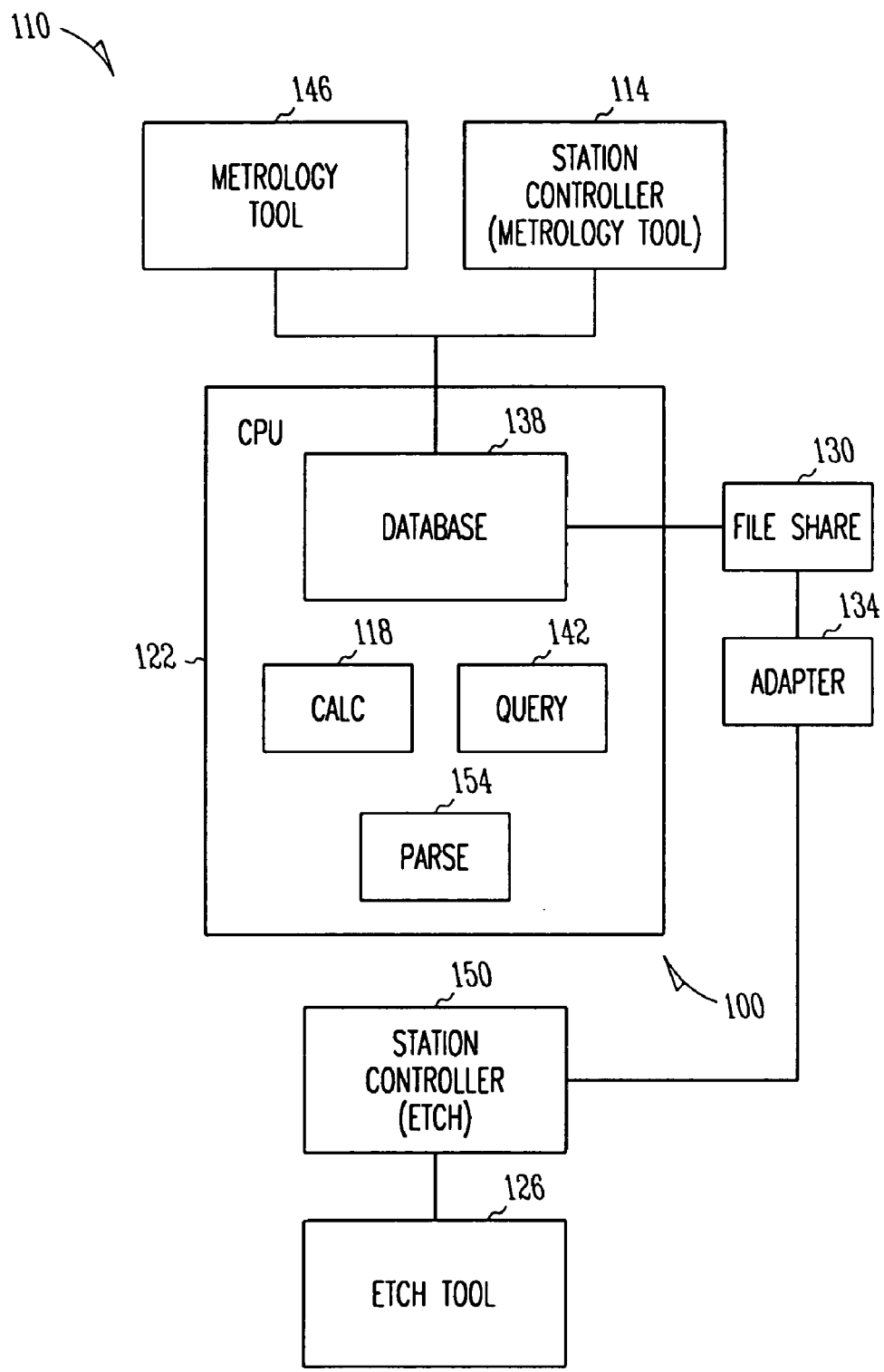
FIG. 1 is a block diagram of apparatus and systems according to various embodiments.

The resolution achieved by lithography may determine the minimum feature size, also called the "critical dimension," with respect to integrated circuits. For example, in complementary metal-oxide semiconductor (CMOS) integrated circuits, the critical dimension may be the gate length. This critical dimension parameter may influence the final performance (e.g., speed, power) of the associated electronic circuitry.

While lithography can be a major factor in process technology, other aspects may also be important. For example, etching processes can go hand in hand with lithography, since after transferring a pattern to the photo resist on the wafer, circuit features are typically etched with high directionality downwards into the substrate. Ensuring the quality and consistency of results becomes more and more demanding as scaling continues.

Current lithography and etch technology can typically achieve wafer-scale line width uniformity of approximately 5% (e.g., for measurements of the same structure within each chip across the wafer). Designs typically assume that the variation within any one chip will be even smaller. However, as noted above, measurements of purportedly identical structures within the same die may reveal much larger variations. Such variations may therefore occur within a single wafer, and more likely, across several wafers within a lot.

In many of the embodiments disclosed herein, the variations from wafer to wafer within a lot may be accommodated by measuring features on several wafers in the lot (including each wafer in the lot), and using such measurements to direct the processing of individual wafers. For example, a computerized process control system that obtains critical dimension data from a metrology tool, sends the data to a station controller, manipulates the data via a formula, and calculates a modified recipe time may be used to control the operation of an etch tool (e.g., a Tel Oxide Unity 85DD etch tool, manufactured by Tokyo Electron Ltd. of Tokyo, Japan). This operation may occur for each wafer to be processed in a high volume computer chip manufacturing environment.

The station controller coupled to the metrology tool may be used to collect critical dimension data, and a data base may be used to store the data for each wafer. An adapter module, such as a software adapter module or object can query the database (which may be contained in a computer). The adapter module, as well as file-sharing mechanisms, may be used to effect communications between various types of standard software, such as the Microsoft® Windows® operating system, and the Unix® operating system. Query result data may be returned to one or more station controllers, perhaps coupled to a computer running under the Microsoft® Windows® operating system. The query result data may be returned in any format, including extensible markup language (XML) format.

The station controller may check wafer numbers (associated with one or more individual wafers, e.g., on a carrier, scanned from each wafer) to make sure they match the query result data. The station controller may operate to apply a formula to the critical dimension data included in the query result data to obtain a modified recipe time (derived from a base time), which may be sent to the etch tool as a message, perhaps in the E40 Process Job SECS (Semiconductor Equipment and Materials International's (SEMI) Communications Standards) message format. The modified recipe time and associated chamber information may be stored in the database, if desired. For more information on the E40 equipment automation software standard, please see the SEMI E40-0703—Standard for Processing Management, approved by the North American Regional Standards Committee on Aug. 29, 2002.

In some embodiments, critical dimension data for each wafer in a lot may be obtained using a metrology tool (e.g., using optical digital profiling), and stored in a database. A station controller may obtain the data by sending queries to the metrology tool using SECS messages, and the data may be stored in a statistical process control database.

Standard query language (SQL) queries may be used, perhaps in conjunction with a software module (e.g., an APC (advanced process control) adapter module software component) to retrieve the critical dimension data for one or more wafers in the lot. Any number of wafers may be included in a lot. However, typical lots to be processed by an etch tool may include up to about 25 wafers.

In some embodiments, the query may be initialized in the etch tool station controller, perhaps operating as an element of a computer running the Microsoft® Windows® operating system. A software module, object, or adapter (e.g., an APC adapter, which may use network application file sharing and other programs to query the SPC database) may be called to effect the query.

The results of the SQL query may be saved in any number of formats, including XML format, and sent to the etch tool station controller (e.g., a Tel Oxide station controller) via file-sharing and a software interface module. The results of the SQL query may also be sent to a software module component controlling the SECS/GEM (SECS/Generic Model for Communications and Control of Manufacturing Equipment) operation of the etch tool.

The query results, perhaps in XML format, may be parsed in the etch tool station controller using optimized search and sort code. Searching and sorting may be needed, for example, if an SQL query returns data for other lots in addition to the lot to be processed.

For each wafer in the lot to be processed by the etch tool, the following formula may be applied to provide a modified recipe time: base time (in seconds)+(delta-to-target/slope)+offset. For example, typical values might be base time=40 seconds, delta-to-target=4 nm, slope=1.9 nm/second, and offset=0.4 seconds. The offset typically varies with chamber, but is generally less than about 1.0. The values of base time, slope, and offset are configurable. Configurable guardbands and deadbands may be provided to guard against the modified recipe time being too far removed from the base time.

Some embodiments may operate to insert the modified recipe time for each wafer into an E40 process job SECS message sent to the etch tool by the etch tool station controller in order to modify the processing time for each wafer in the lot.

When wafer measurements are made, a single measurement may serve to provide a critical dimension. However, several measurements may also be made, and an average taken to provide the critical dimension. For example, the critical dimension may comprise an average of measurements taken at eight sites across the same wafer, and can be recorded in a database as a nested horizontal mean. The critical dimension for the wafer, minus the target value, can be found in the database and used to provide the delta-to-target dimension.

For the purposes of this document, the "target value" may comprise a desired value for a critical dimension, as opposed to an actual, measured value for the same critical dimension. In addition, for the purposes of this document, a "critical dimension" is any physical measurement that may be made with respect to a semiconductor wafer (e.g., feature height, feature width, feature length, thickness, density, weight, electron mobility, conductivity, etc.), as well as averaged and other statistically-processed versions of such measurements.

The base time may be determined by engineering experiments and may be product specific. The base time may be set so as to provide a desired etch bias distance for the product. The slope may be calculated by performing modified recipe time versus etch bias distance experiments. Thus, wafers may be processed with a variety of modified recipe times in an attempt to correlate etch bias distance to etch time. This correlation can then provide the slope as a relationship in nm/second.

Chamber offset may also be determined experimentally, and may be used to match chambers. For example, if one chamber is consistently running at a different etch bias distance than another, some amount of chamber offset time may be used to compensate for the difference.

Thus, it can be seen that many embodiments may be realized. For example, FIG. 1 is a block diagram of apparatus 100 and systems 110 according to various embodiments, each of which may operate in the manner previously described. In some embodiments, an apparatus 100 may include a station controller 114 to receive a critical dimension of each wafer included in a lot of wafers, and a calculation module 118, perhaps included in a computer 122, to calculate a modified recipe time for each wafer in the lot.

The modified recipe time may be approximately equal to the sum of a base time, an offset time, and a quotient of a delta-to-target dimension divided by a slope relationship. The delta-to-target dimension may be determined by the critical dimension and a selected target value. The calculation module 118 may operate to transmit the modified recipe time to an etch tool 126 (e.g., using a file sharing module 130 and/or an adapter module 134) for processing one or more selected wafers included in the lot of wafers according to the modified recipe time. As noted above, each one of the wafers in the lot may be processed according to a unique modified recipe time based on a critical dimension associated with a particular wafer, either the same wafer that is to be processed, or a different wafer.

The apparatus 100 may include a database module 138 to store the critical dimension of one or more wafers selected from the lot of wafers. The apparatus 100 may also include a database query module 142 that operates to send a query to the database module 138 and to receive a query result including one or more critical dimension for one or more wafers in a lot. As noted previously, each critical dimension may comprise a nested horizontal mean associated with one or more selected wafers.

In another embodiment, a system 110, may comprise one or more apparatus 100 as described above, as well as a first station controller 114 (e.g., a metrology tool station controller), a metrology tool 146 coupled to the first station controller, and an etch tool 126 to receive the modified recipe time from the calculation module 118 and to process one or more selected wafers included in the lot of wafers according to the modified recipe time. In this case also, several wafers in the lot (including each of the wafers in the lot) may be processed according to an individualized modified recipe time based on the critical dimension associated with a particular wafer, either the same wafer that is to be processed, or a different wafer.

The system 110 may include a second station controller 150 (e.g., an etch tool station controller) coupled to the etch tool 126, as well as a parsing module 154 to extract critical dimensions from one or more database query results and to send the critical dimensions to the second station controller 150.

The apparatus 100, system 110, station controllers 114, 150 calculation module 118, computer 122, etch tool 126, file sharing module 130, adapter module 134, database module 138, database query module 142, metrology tool 146, and parsing module 154 may all be characterized as "modules" herein. Such modules may include hardware circuitry, and/or one or more processors and/or memory circuits, software program modules, including objects and collections of objects, and/or firmware, and combinations thereof, as desired by the architect of the apparatus 100 and systems 110, and as appropriate for particular implementations of various embodiments.

It should also be understood that the apparatus and systems of various embodiments can be implemented with respect to applications other than wafer lot process control, and thus, various embodiments are not to be so limited. The illustrations of various apparatus 100 and systems 110 are intended to provide a general understanding of the structure of various embodiments, and they are not intended to serve as a complete description of all the elements and features of apparatus and systems that might make use of the mechanisms described herein.

Applications that may include the novel apparatus and systems of various embodiments include electronic circuitry used in high-speed computers, communication and signal processing circuitry, modems, processor modules, embedded processors, and application-specific modules, including multilayer, multichip modules. Such apparatus and systems may further be included as subcomponents within a variety of electronic systems, such as personal computers, laptop computers, workstations, controllers and others.

Figure 2:
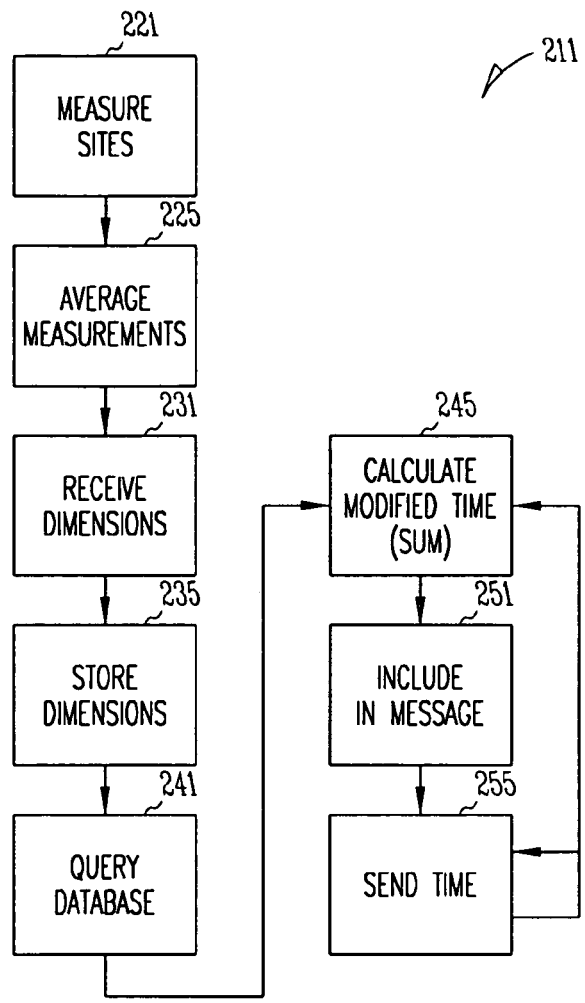
FIG. 2 is a flow chart illustrating several methods according to various embodiments.

FIG. 2 is a flow chart illustrating several methods according to various embodiments. A method 211 may (optionally) begin with measuring a plurality of sites across one or more selected wafers in a lot to provide a corresponding plurality of measurements at block 221, and processing (e.g., summing, averaging, or statistically manipulating) the corresponding plurality of measurements to provide a critical dimension at block 225. For example, measurements may be made at eight sites on a single wafer, and an average of the eight measurements may be taken as the critical dimension associated with that particular wafer. Measurements may be taken for each wafer in a lot, and each wafer in a lot may have its own associated critical dimension.

The method 211 may continue with receiving one or more critical dimensions associated with each wafer included in a lot of wafers at a station controller coupled to a metrology tool at block 231, and storing the critical dimensions in a database at block 235. The method 211 may include querying the database to obtain one or more critical dimensions, which may be indexed according to one or more wafer numbers associated with one or more corresponding, selected wafers at block 241. The critical dimensions may be received in XML format from the database.

The method 211 may continue with calculating a modified recipe time associated with each wafer in the lot of wafers based on one or more critical dimensions associated with each wafer and a base time at block 245. Calculating the modified recipe time for each wafer may include calculating a time value approximately equal to a sum of the base time, an offset time, and a quotient of a delta-to-target dimension divided by a slope relationship, wherein the delta-to-target dimension is approximately equal to the critical dimension minus a selected target value.

The slope relationship may be approximately equal to a quotient of an etch bias distance divided by an etch time, and may be determined by experimentally correlating an etch time to an etch bias distance using a plurality of modified recipe times, including one or more of the modified recipe times calculated for individual wafers included in a specific lot.

The offset time may be associated with a particular chamber selected to process the lot of wafers. As noted above, a critical dimension may comprise an average of measurements taken at a plurality of sites across one or more selected wafers.

One or more critical dimensions, as well as modified recipe times may be incorporated into a message at block 251, such as a SECS message, and the method 211 may include sending the modified recipe time in the message to a station controller coupled to an etch tool to process one or more selected wafers included in the lot of wafers at block 255. The method 211 may include repeatedly sending the modified recipe time (or times) for all wafers included in a lot of wafers at block 255 as well as repeatedly calculating modified recipe times and including critical dimensions and/or the calculated modified recipe times in messages at blocks 245 and 251.

It should be noted that the methods described herein do not have to be executed in the order described, or in any particular order. Moreover, various activities described with respect to the methods identified herein can be executed in serial or parallel fashion. Information, including parameters, commands, operands, and other data, can be sent and received in the form of one or more carrier waves.

Upon reading and comprehending the content of this disclosure, one of ordinary skill in the art will understand the manner in which a software program can be launched from a computer-readable medium in a computer-based system to execute the functions defined in the software program. One of ordinary skill in the art will further understand the various programming languages that may be employed to create one or more software programs designed to implement and perform the methods disclosed herein. The programs may be structured in an object-orientated format using an object-oriented language such as Java, Smalltalk, or C++. Alternatively, the programs can be structured in a procedure-orientated format using a procedural language, such as assembly or C. The software components may communicate using any of a number of mechanisms known to those skilled in the art, such as application program interfaces or inter-process communication techniques, including remote procedure calls. The teachings of various embodiments are not limited to any particular programming language or environment, including Hypertext Markup Language (HTML) and XML.

Figure 3:
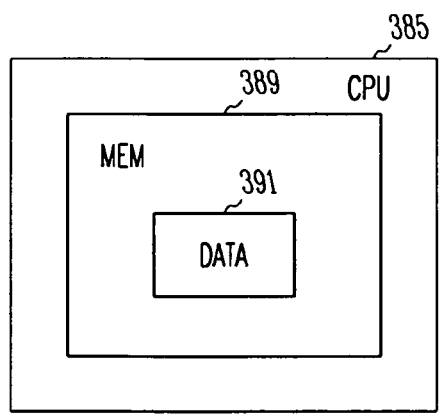
FIG. 3 is a block diagram of an article according to various embodiments.

FIG. 3 is a block diagram of an article 385 according to various embodiments, such as a computer, a memory system, a magnetic or optical disk, some other storage device, and/or any type of electronic device or system. The article 385 may comprise a machine-accessible medium such as a memory 389 (e.g., a memory including an electrical, optical, or electromagnetic conductor) having associated data 391 (e.g., computer program instructions), which when accessed, results in a machine performing such actions as receiving a critical dimension associated with each wafer included in a lot of wafers at a station controller coupled to a metrology tool, calculating a modified recipe time associated with each wafer in the lot of wafers based on the critical dimension and a base time, and sending the modified recipe time in a message to a station controller coupled to an etch tool to process a selected wafer included in the lot of wafers.

As noted above, calculating the modified recipe time may include calculating a time value approximately equal to a sum of the base time, an offset time, and a quotient of a delta-to-target dimension divided by a slope relationship, wherein the delta-to-target dimension is approximately equal to the critical dimension minus a selected target value. The offset time may be associated with a particular chamber selected to process the lot of wafers. The slope relationship may be determined by experimentally correlating an etch time to an etch bias distance using a plurality of modified recipe times including the modified recipe time. The critical dimension may comprise an average of measurements taken at a plurality of sites across the selected wafer.

Implementing the apparatus, systems, and methods disclosed herein may result in better control of wafer processes. The improved consistency which may be achieved can provide better yields and reduced manufacturing costs.

The accompanying drawings that form a part hereof, show by way of illustration, and not of limitation, specific embodiments in which the subject matter may be practiced.

The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A method, comprising:
    receiving a critical dimension associated with each wafer included in a lot of wafers at a station controller coupled to a metrology tool;
    calculating a modified recipe time associated with each wafer in the lot of wafers based on a delta-to-target dimension and a base time; and
    sending the modified recipe time in a message to a station controller coupled to an etch tool to process a selected wafer included in the lot of wafers.

2. The method of claim 1, further comprising:
    repeating the sending for all wafers included in the lot of wafers.

3. The method of claim 1, further comprising:
    storing the critical dimension in a database.

4. The method of claim 1, wherein the message comprises a Semiconductor Equipment and Materials International (SEMI) Equipment Communication Standard (SECS) message, further comprising:
    incorporating the critical dimension into the SECS message.

5. The method of claim 1, wherein calculating the modified recipe time further comprises:
    calculating a time value approximately equal to a sum of the base time, an offset time, and a quotient of the delta-to-target dimension divided by a slope relationship, wherein the delta-to-target dimension is approximately equal to the critical dimension minus a selected target value.

6. The method of claim 5, wherein the slope relationship is approximately equal to a quotient of an etch bias distance divided by an etch time.

7. The method of claim 1, further comprising:
    querying a database to obtain the critical dimension indexed according to a wafer number associated with the selected wafer.

8. The method of claim 1, further comprising:
    measuring a plurality of sites across a single wafer to provide a corresponding plurality of measurements; and
    processing the corresponding plurality of measurements to provide the critical dimension.

9. An article comprising a machine-accessible medium having associated data, wherein the data, when accessed, results in a machine performing:
    receiving a critical dimension associated with each wafer included in a lot of wafers at a station controller coupled to a metrology tool;
    calculating a modified recipe time associated with each wafer in the lot of wafers based on a delta-to-target dimension and a base time; and
    sending the modified recipe time in a message to a station controller coupled to an etch tool to process a selected wafer included in the lot of wafers.

10. The article of claim 9, wherein the data, when accessed, results in the machine performing:
    receiving the critical dimension in extensible markup language (XML) format from a database.

11. The article of claim 9, wherein calculating the modified recipe time further comprises:
    calculating a time value approximately equal to a sum of the base time, an offset time, and a quotient of the delta-to-target dimension divided by a slope relationship, wherein the delta-to-target dimension is approximately equal to the critical dimension minus a selected target value.

12. The article of claim 11, wherein the offset time is associated with a chamber selected to process the lot of wafers.

13. The article of claim 11, wherein the slope relationship is determined by experimentally correlating an etch time to an etch bias distance using a plurality of modified recipe times including the modified recipe time.

14. The article of claim 9, wherein the critical dimension comprises an average of measurements taken at a plurality of sites across a single wafer.

15. An apparatus, comprising:
    a station controller to receive a critical dimension of each wafer included in a lot of wafers; and
    a module to calculate a modified recipe time approximately equal to a sum of a base time, an offset time, and a quotient of a delta-to-target dimension divided by a slope relationship, wherein the delta-to-target dimension is determined by the critical dimension and a selected target value, and wherein the module is to transmit the modified recipe time to an etch tool for processing a selected wafer included in the lot of wafers according to the modified recipe time.

16. The apparatus of claim 15, further comprising:
    a database module to store the critical dimension of a selected wafer included in the lot of wafers.

17. The apparatus of claim 16, further comprising:
    a database query module to send a query to the database module and to receive a query result including the critical dimension.

18. A system, comprising:

a first station controller to receive a critical dimension of each wafer included in a lot of wafers;

a module to calculate a modified recipe time approximately equal to a sum of a base time, an offset time, and a quotient of a delta-to-target dimension divided by a slope relationship, wherein the delta-to-target dimension is determined by the critical dimension and a selected target value; and an etch tool to receive the modified recipe time from the module and to process a selected wafer included in the lot of wafers according to the modified recipe time.

19. The system of claim 18, further comprising:

a parsing module to extract the critical dimension from a database query result and to send the critical dimension to a second station controller coupled to the etch tool.

20. The system of claim 18, further comprising:

a metrology tool coupled to the first station controller.

21. The system of claim 18, further comprising:

a second station controller coupled to the etch tool.

22. The system of claim 18, wherein the critical dimension comprises a nested horizontal mean associated with the selected wafer.

* * * * *